(12) United States Patent
Takemoto

(10) Patent No.: US 8,744,181 B2
(45) Date of Patent: Jun. 3, 2014

(54) IMAGE PROCESSING APPARATUS AND COMPUTER READABLE MEDIUM

(75) Inventor: Takashi Takemoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 649 days.

(21) Appl. No.: 12/966,354

(22) Filed: Dec. 13, 2010

(65) Prior Publication Data

US 2011/0142333 A1 Jun. 16, 2011

(30) Foreign Application Priority Data

Dec. 15, 2009 (JP) ................ P2009-284317

(51) Int. Cl.
*G06K 9/00* (2006.01)
*H04N 9/68* (2006.01)
*H03M 7/24* (2006.01)

(52) U.S. Cl.
CPC .. *H04N 9/68* (2013.01); *H03M 7/24* (2013.01)
USPC ......................................................... 382/166

(58) Field of Classification Search
None
See application file for complete search history.

(56) References Cited

U.S. PATENT DOCUMENTS

| 7,339,583 | B2 | 3/2008 | Mihara et al. | |
|---|---|---|---|---|
| 8,432,410 | B1 * | 4/2013 | Kilgard | 345/581 |
| 2002/0047846 | A1 * | 4/2002 | Lindholm et al. | 345/522 |
| 2004/0012600 | A1 * | 1/2004 | Deering et al. | 345/506 |
| 2005/0237335 | A1 * | 10/2005 | Koguchi et al. | 345/582 |
| 2007/0172120 | A1 | 7/2007 | Roimela et al. | |
| 2007/0258641 | A1 * | 11/2007 | Srinivasan et al. | 382/166 |
| 2011/0142333 | A1 * | 6/2011 | Takemoto | 382/162 |

FOREIGN PATENT DOCUMENTS

| JP | 06-209430 | 7/1994 |
|---|---|---|
| JP | 06-309146 | 11/1994 |
| JP | 2008-520048 | 6/2008 |
| JP | 2008-236726 | 10/2008 |

OTHER PUBLICATIONS

Tchou, Chris, "HDR the BUNGIE Way," Microsoft Game Technology Conference, Aug. 14, 2006, Microsoft Corporation (2005), 19 pgs.

Office Action for Japanese Patent Application No. 2009-284317, dated May 22, 2013, 2 pgs., Japanese Patent Office (English translation only).

Hamada, Tsuyoshi and Nakasato, Naohito, "Developing a Parallel Reconfigurable System for Physics Computations," The Institute of Electronics, Information and Communication Engineers, IEICE Technical Report, RECONF2005-20(May 2005), pp. 31-36 (with English translation of abstract).

* cited by examiner

*Primary Examiner* — Sean Motsinger

(74) *Attorney, Agent, or Firm* — Sprinkle IP Law Group

(57) ABSTRACT

Image processing apparatus of the embodiments includes a storage which stores data on any of color and brightness of a pixel represented in a first floating-point format including a significand represented in an integer-bit length and an exponent represented in a non-integer-bit length; and an image processor which processes the data.

10 Claims, 7 Drawing Sheets

IMAGE PROCESSING APPARATUS AND COMPUTER READABLE MEDIUM

CROSS-REFERENCE TO RELATED APPLICATIONS

This Application is based upon and claims the benefit of priority from the prior Japanese Patent Application No. P2009-284317, filed on Dec. 15, 2009; the entire contents of which are incorporated herein by reference.

BACKGROUND

1. Field

Embodiments described herein relate generally to image processing apparatus.

2. Description of Related Art

To create a high-quality computer graphics image, the importance of the high dynamic-range rendering (HDR) techniques is growing. In the HDR, the color of each pixel needs to be processed in a large dynamic range exceeding a range of 0 to 1.0.

Here, R16G16B16A16_FLOAT is a widely-used format to represent the brightness of each RGB component of pixels in a frame buffer in a 16-bit floating-point format (5 bits for the exponent, 11 bits for the significand). However, in this method, 3×16 bits are needed to represent the brightness of RGB components in total. Accordingly, when an alpha component for representing the transparency is also taken into consideration, 64 bits are consumed per pixel, and thereby the needs for the memory capacity and the memory bandwidth are increased.

To decrease such memory capacity and memory bandwidth by half, several formats are also proposed to represent each pixel by 32 bits. For example, in DirectX 10 of Microsoft Corporation, floating-point based formats such as R9G9B9E5_SHAREDEXP and R11G11B10_FLOAT are defined. Moreover, in a commercial game console, the Xbox 360, a format called R10G10B10A2_FLOAT is used.

Furthermore, for example, Patent Document discloses the following method. Specifically, an image is divided into multiple image blocks; color information and luminance information on each pixel in each image block in a high dynamic-range value of pixels are separated; and the color information on the pixels in the image block and the luminance information on the pixels in the image block are compressed independently from each other.

However, R9G9B9E5_SHAREDEXP has a problem that, since the exponent is common to RGB components, the precision is extremely lowered when the color is saturated.

Moreover, R11G11B10_FLOAT has a problem that, since the significand for a B channel is as small as 5 bits, Mach bands may be perceived.

In a case of R10G10B10A2_FLOAT, the scales of encoding and decoding circuits do not have to be larger. However, R10G10B10A2_FLOAT also has a problem that, since only 3 bits are assigned to the exponent, there are shortages of dynamic range and precision, and thereby Mach bands may be perceived.

DETAILED DESCRIPTION

Hereinafter, a format used to represent image data and an image processing apparatus according to embodiments of the present invention will be described with reference to the drawings. Note that, although the description will be given below by taking an example where the color of a pixel is represented by three RGB elements, the present invention is not limited to the case where the color of a pixel is represented by the three RGB elements. The present invention may also be applied to a case, for example, where the color of a pixel is represented by three YUV elements, and so forth.

First Embodiment

Figure 1:
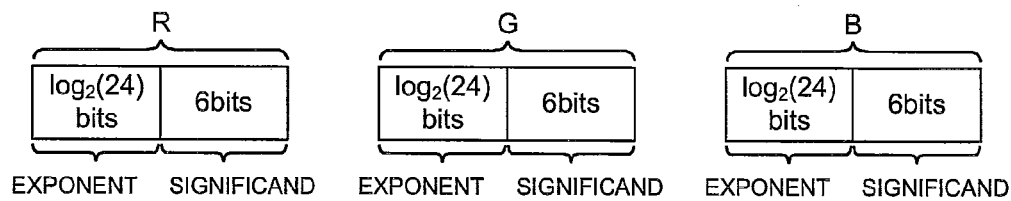
FIG. 1 is a drawing showing one example of a format according to a first embodiment of the present invention, the format representing the brightness of each RGB element in a floating-point format.

FIG. 1 is a drawing showing one example of a format according to a first embodiment of the present invention, the format representing the brightness of each RGB color in a floating-point format.

In the format of FIG. 1, the brightness of each RGB color is represented in the floating-point format with 6 bits for the significand and $\log_2(24)$ bits (approximately 4.585 bits) for the exponent.

Here, the $\log_2(24)$-bit exponent can represent the range of $m*2^n$ to $m*2^{n+23}$, where n is any integer and m is a value of the significand.

The exponents of RGB colors represented in the format of FIG. 1 can be encoded collectively into 14 bits.

Specifically, since the relation of $3*\log_2(24)=\log_2(3^3*2^9)$ $<\log_2(2^{14})$ is satisfied, an information amount of the exponents of the three RGB colors can be suppressed to 14 bits or smaller.

Thereby, even when 6 bits are assigned to the significand of each RGB color, the number of bits assigned per pixel can be suppressed to 32 bits or smaller, while the decrease in the number of bits assigned to the exponent of each RGB color can be suppressed. Thus, it is possible to suppress increases in a memory capacity and a memory bandwidth, while ensuring a large dynamic range, and further to prevent Mach bands from being perceived.

Note that, when the exponent is 0, the significand may be a denormal number. In this case, the minimum resolution becomes $2^{n-5}$, and the dynamic range can be enlarged to $2^{n+23}/2^{n-5}=2^{28}$.

Second Embodiment

Figure 2:
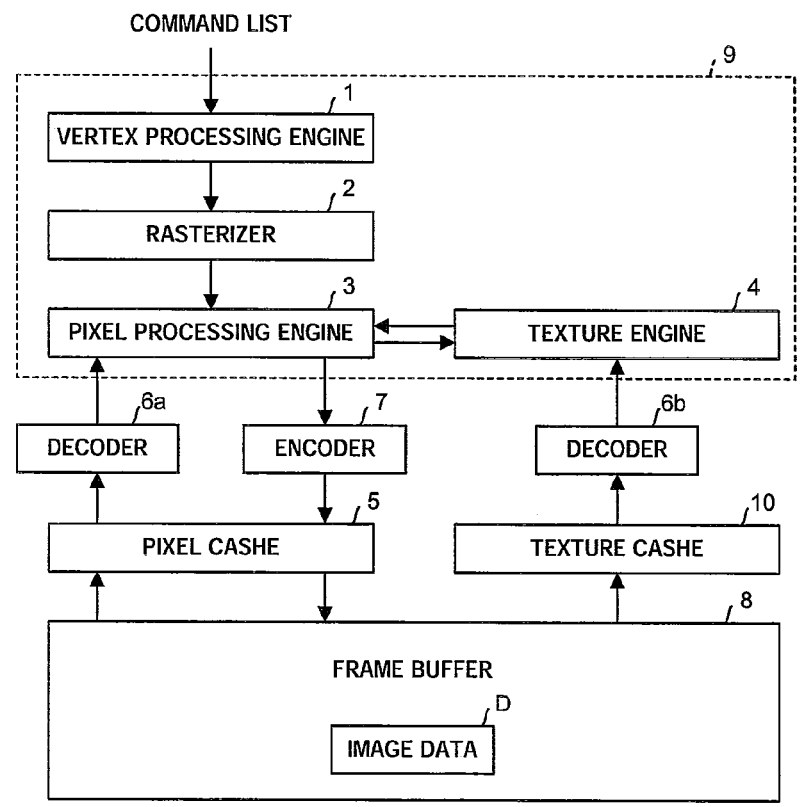
FIG. 2 is a block diagram showing a schematic configuration of an image processing apparatus according to a second embodiment of the present invention.

FIG. 2 is a block diagram showing a schematic configuration of an image processing apparatus according to a second embodiment of the present invention.

The image processing apparatus in FIG. 2 includes an image processor 9, decoders 6a, 6b, an encoder 7, a pixel cache 5, a texture cache 10, and a frame buffer 8. The image processor 9 is capable of processing image data D. The frame buffer 8 is capable of storing the image data D processed by the image processor 9. Note that, the image data D can be represented in a raster format using the format of FIG. 1. The decoders 6a, 6b are capable of converting the image data D represented in the format of FIG. 1 into image data D represented in a format used in the image processor 9. The encoder 7 is capable of converting the image data D represented in the format used in the image processor 9 into the image data D represented in the format of FIG. 1. The pixel cache 5 is capable of holding pixel data provided with attributes. Note that, the pixel cache 5 can hold pixel data for each entry (rectangle), for example. The texture cache 10 is capable of temporarily holding the attributes of pixels read out from the frame buffer 8. Incidentally, examples of the attributes of pixels include color, design, texture, etc.

Here, the image processor 9 includes a vertex processing engine 1, a rasterizer 2, a pixel processing engine 3 and a texture engine 4. The vertex processing engine 1 is capable of transforming the coordinates of vertexes of triangles representing a figure. Incidentally, examples of the vertex coordinate transformation includes coordinate transformations performed along with rotation, scaling, and so on of a figure constituted of vertexes. Moreover, the vertex processing engine 1 may convert drawing data (a starting point, an ending point, a control point, etc) and a drawing command in a command list into multiple triangles forming a stroke. Incidentally, the drawing data in the command list can be represented in a format such as, for example, a vector format other than the raster format. The rasterizer 2 is capable of converting the triangles constituted of vertexes into a collection of pixels. The texture engine 4 is capable of holding and processing the attributes of the pixels. For example, the texture engine 4 can compute a memory address from the texture coordinates and act as a texture filter. Incidentally, examples of the pixel attributes include color, design, texture, etc. The pixel processing engine 3 receives the attributes and the like acquired by the texture engine 4, and is capable of creating attributes provided to the pixels by a certain arithmetic process.

In the vertex processing engine 1, drawing data and a drawing command in the command list are converted into multiple triangles forming a stroke. The coordinates of the vertexes constituting the triangles are transformed, and then inputted into the rasterizer 2. Subsequently, in the rasterizer 2, the triangles constituted of the vertexes are converted into a collection of pixels, and inputted into the pixel processing engine 3.

Meanwhile, the image data D stored in the frame buffer 8 is outputted to the decoder 6b through the texture cache 10, converted from the format of FIG. 1 into the format used in the image processor 9, and thereafter transferred to the texture engine 4. The texture engine 4 processes the attributes of the pixels, and then the processed image data D are outputted into the pixel processing engine 3. Moreover, the image data D stored in the frame buffer 8 is outputted to the decoder 6a through the pixel cache 5. After converted from the format of FIG. 1 into the format used in the image processor 9, the image data D is transferred to the pixel processing engine 3.

Then, in the pixel processing engine 3, the attributes provided to the pixels in the end are computed and transferred to the encoder 7. After the format used in the image processor 9 is converted into the format of FIG. 1 in the encoder 7, the information is, for example, overwritten on the image data D stored in the pixel cache 5 to update the image data D. Subsequently, the image data D on the pixel cache 5 thus updated by the pixel processing engine 3 is stored in the frame buffer 8.

Figure 3:
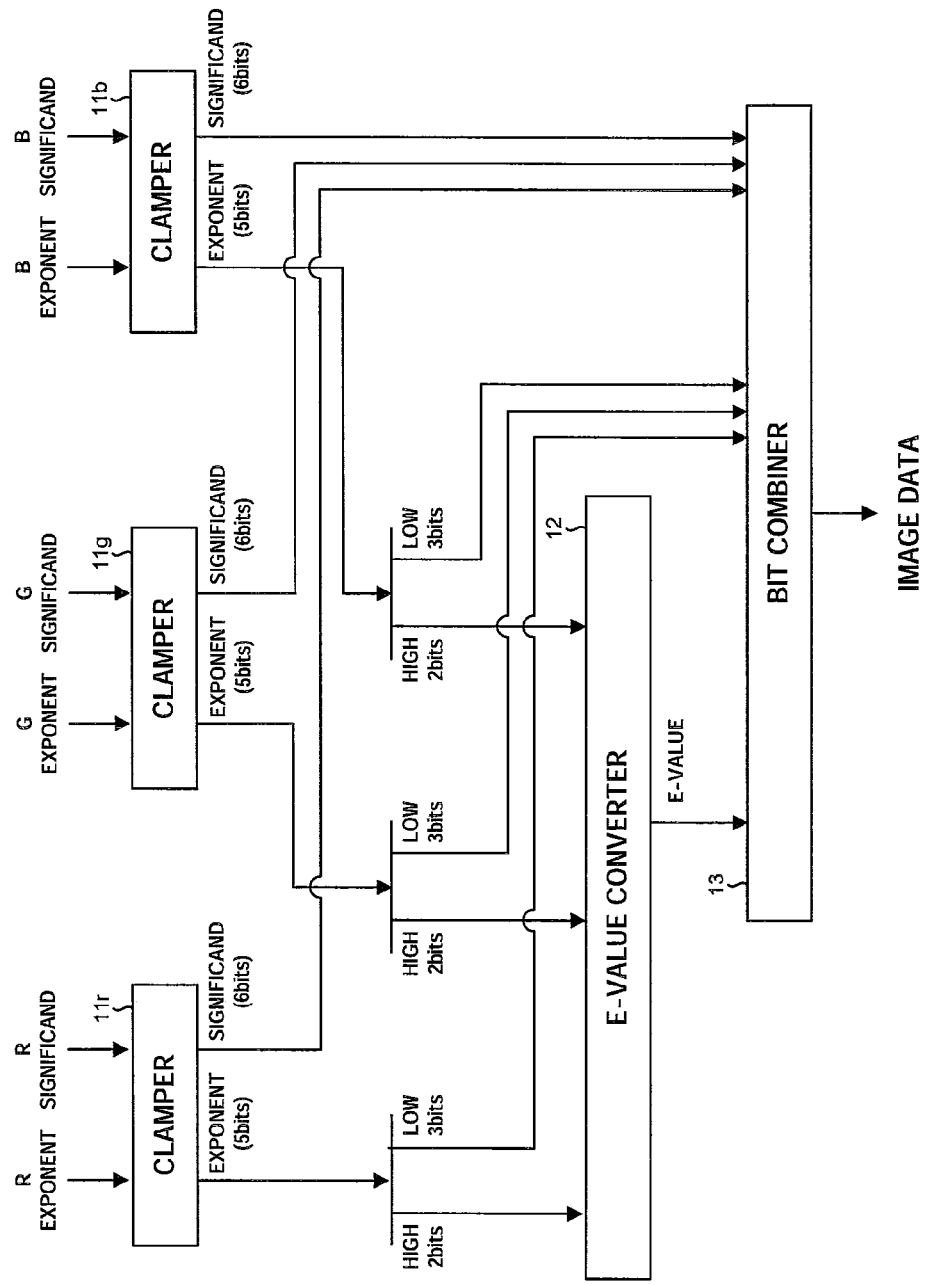
FIG. 3 is a diagram showing one example of an encoder 7 in FIG. 2 for the format of FIG. 1.

FIG. 3 is a diagram showing one example of the encoder 7 in FIG. 2 for the format of FIG. 1.

In FIG. 3, the encoder 7 of FIG. 2 includes clampers 11r, 11g, 11b, an E-value converter 12, and a bit combiner 13. The clampers 11r, 11g, 11b are each capable of clamping the value of the corresponding RGB element (hereinafter, referred to as each RGB value) used in the image processor 9 within a range representable in the format of FIG. 1. Note that, each of the clampers 11r, 11g, 11b may convert the significand as necessary into a denormal number. The E-value converter 12 is capable of converting higher-order 2 bits in the exponents of RGB values together into 5 bits of a compression index code (referred to as an E value). Incidentally, the E-value converter 12 may be configured of a group of computing units or a table. The bit combiner 13 is capable of creating a value of 32 bits by combining the 5 bits of the E value obtained by the E-value converter 12, lower-order 3 bits in the exponents of RGB values, and 6 bits of the significands of the RGB values together. Note that, each RGB value inputted into the encoder 7 is a floating-point number.

When inputted into the clampers 11r, 11g, 11b, the RGB values are respectively clamped within ranges representable in the format of FIG. 1. Then, higher-order 2 bits in the exponent of each RGB value are outputted into the E-value converter 12, while lower-order 3 bits in the exponent of each RGB value and 6 bits of the significand of each RGB value are outputted into the bit combiner 13. In the E-value converter 12, the higher-order 2 bits in the exponents of the RGB values are together converted into 5 bits of the E value and outputted into the bit combiner 13. Then, in the bit combiner 13, the 5 bits of the E value obtained in the E-value converter 12, the lower-order 3 bits in the exponents of the RGB values, the 6 bits of the significands of the RGB values are combined to create the image data D represented the format of FIG. 1.

Specifically, in each of the clampers 11r, 11g, 11b, the exponent of n to n+23 of each RGB value is represented by 0 to 23 in the 5-bit binary code for each RGB element. In this respect, suppose that sets of the higher-order 2 bits in the exponents of the RGB values are denoted by Re, Ge, and Be, respectively. Here, the 5 bits of the E value can be obtained by computing $E=Re*3^2+Ge*3+Be$, for example, in the E-value converter 12, where the relation among Re, Ge, Be is switchable in any manner. Note that, since Re, Ge, and Be can take a value in the range of 0 to 2, the range of E is 0 to 26. Thus, E is representable by 5 bits. When the 5 bits of the E value and the lower-order 3 bits in the exponents of the RGB values are combined together, 14 bits are obtained overall.

Here, when the exponent of the brightness of each RGB color is represented by $\log_2(24)$ bits, the higher-order 2 bits and the lower-order 3 bits in the exponent can be handled separately. This allows the E-value converter 12 to receive 6 bits and to output 5 bits, simplifying the configuration of the E-value converter 12.

Figure 4:
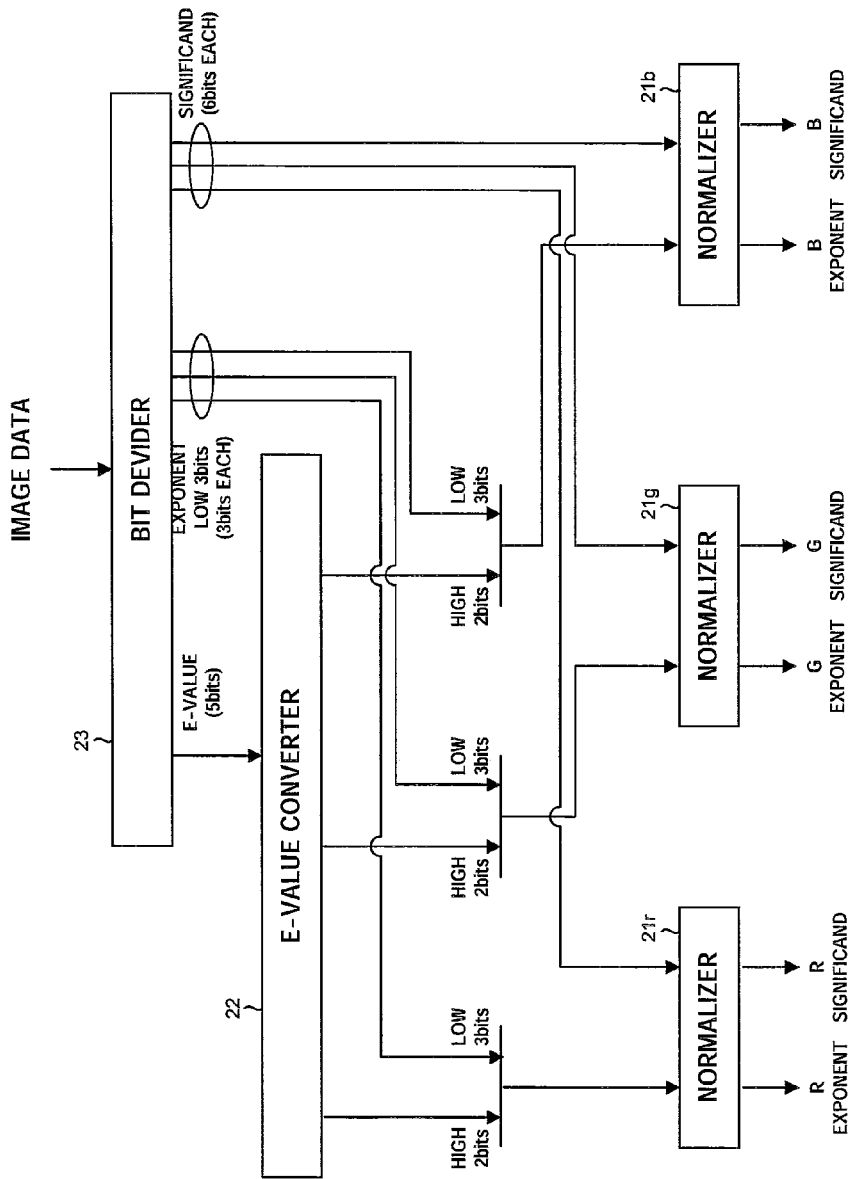
FIG. 4 is a diagram showing one example of decoders 6a, 6b in FIG. 2 for the format of FIG. 1.

FIG. 4 is a diagram showing one example of the decoders 6a, 6b in FIG. 2 for the format of FIG. 1.

In FIG. 4, the decoders 6a, 6b of FIG. 2 each include normalizers 21r, 21g, 21b, an E-value inverter 22 and a bit divider 23. The bit divider 23 is capable of dividing a value of 32 bits represented in the format of FIG. 1 into: 5 bits of the E value, lower-order 3 bits in the exponents of the RGB values, and 6 bits of the significands of the RGB values. The E-value inverter 22 is capable of inverting the 5 bits of the E value back into higher-order 2 bits in the exponents of the RGB values.

Incidentally, the E-value inverter 22 may be configured of a group of computing units or a table. The normalizers 21*r*, 21*g*, 21*b* are each capable of converting the higher-order 2 bits in the exponent of each of the RGB values, the lower-order 3 bits in the exponent of the each RGB value, and the 6 bits of the significand of the each RGB value into each RGB value used in the image processor 9.

When inputted into the bit divider 23, the image data D represented in the format of FIG. 1 is divided into: 5 bits of the E value, lower-order 3 bits in the exponents of RGB values, and 6 bits of the significands of the RGB values. The 5 bits of the E value is then outputted into the E-value inverter 22, while the lower-order 3 bits in the exponent of each RGB value and the 6 bits of the significand of the RGB value are outputted into the corresponding one of the normalizers 21*r*, 21*g*, 21*b*.

Subsequently, in the E-value inverter 22, the 5 bits of the E value are inverted into higher-order 2 bits in the exponents of the RGB values, and the higher-order 2 bits in the exponent of each RGB value are outputted into the corresponding one of the normalizers 21*r*, 21*g*, 21*b*. Each of the normalizers 21*r*, 21*g*, 21*b* normalizes the higher-order 2 bits in the exponent of each of the RGB values, the lower-order 3 bits in the exponent of the each RGB value, and the 6 bits of the significand of the each RGB value, according to the floating-point format, which are then outputted into the image processor 9.

Third Embodiment

Figure 5:
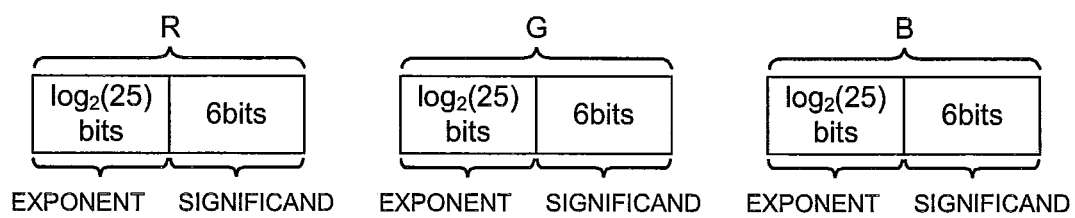
FIG. 5 is a drawing showing one example of a format according to a third embodiment of the present invention, the format representing the brightness of each RGB color in a floating-point format.

FIG. 5 is a drawing showing one example of a format according to a third embodiment of the present invention, the format representing the brightness of each RGB color in a floating-point format.

In the format of FIG. 5, the brightness of each RGB color is represented in the floating-point format with 6 bits for the significand and $\log_2(25)$ bits (approximately 4.664 bits) for the exponent.

Here, the $\log_2(25)$-bit exponent can represent the range of $m*2^n$ to $m*2^{n+24}$, where n is any integer and m is a value of the significand.

The exponents of RGB colors represented in the format of FIG. 5 can be encoded collectively into 14 bits.

Specifically, since the relation of $3*\log_2(25)=\log_2(5^6) <\log_2(2^{14})$ is satisfied, an information amount of the exponents of the three RGB colors can be suppressed to 14 bits or smaller.

Thereby, even when 6 bits are assigned to the significand of each RGB color, the number of bits assigned per pixel can be suppressed to 32 bits or smaller, while the decrease in the number of bits assigned to the exponent of each RGB color can be suppressed. Thus, it is possible to suppress increases in a memory capacity and a memory bandwidth, while ensuring a large dynamic range, and further to prevent Mach bands from being perceived.

Note that, when the exponent is 0, the significand may be a denormal number. In this case, the minimum resolution becomes $2^{n-5}$, and the dynamic range can be enlarged to $2^{n+24}/2^{n-5}=2^{29}$.

Figure 6:
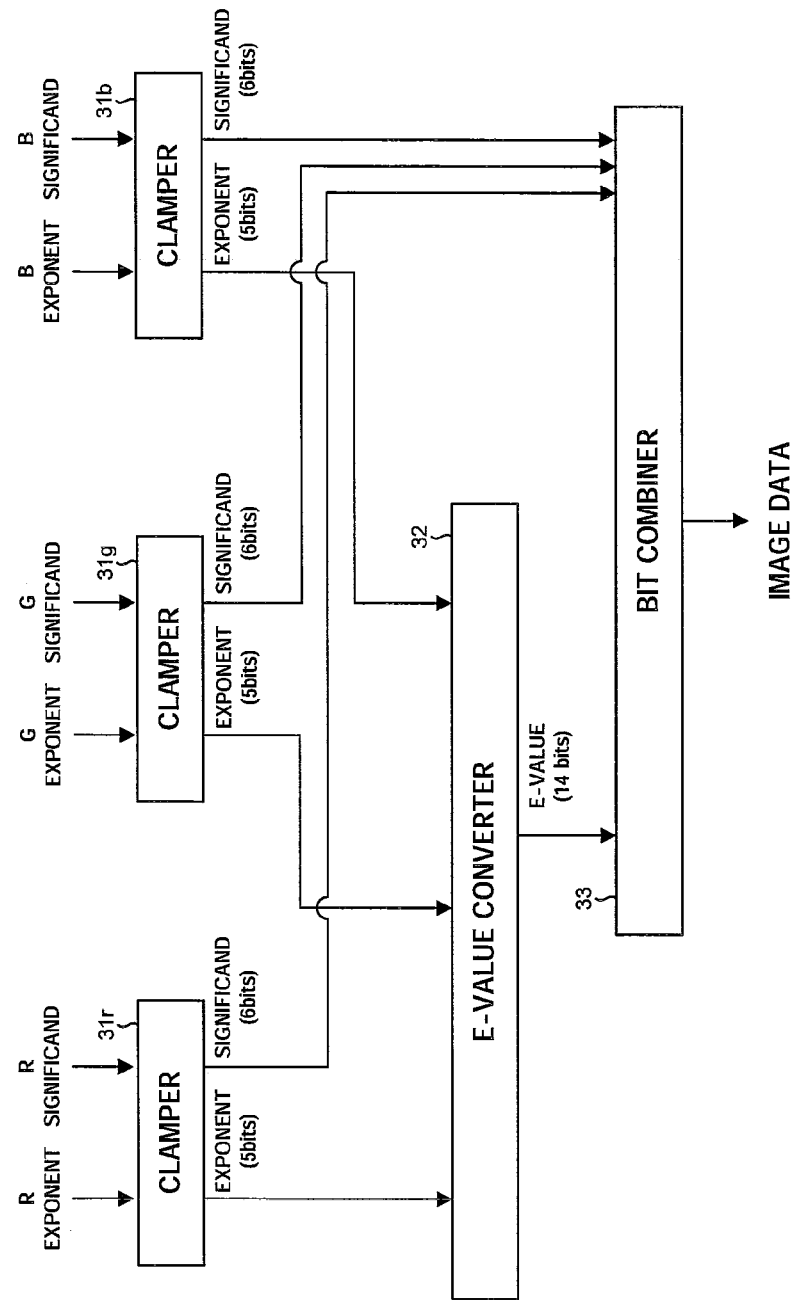
FIG. 6 is a diagram showing one example of the encoder 7 in FIG. 2 for the format of FIG. 5.

FIG. 6 is a diagram showing one example of the encoder 7 in FIG. 2 for the format of FIG. 5.

In FIG. 6, the encoder 7 of FIG. 2 includes clampers 31*r*, 31*g*, 31*b*, an E-value converter 32, and a bit combiner 33. The clampers 31*r*, 31*g*, 31*b* are each capable of clamping the value of the corresponding RGB value used in the image processor 9 within a range representable in the format of FIG. 5. Note that, each of the clampers 31*r*, 31*g*, 31*b* may convert the significand as necessary into a denormal number. The E-value converter 32 is capable of converting 5 bits in the exponents of RGB values together into 14 bits of an E value.

Incidentally, the E-value converter 32 is equivalent to a radix converter which converts a biquinary number into a binary number, and may be configured of a group of computing units or a table. The bit combiner 33 is capable of creating a value of 32 bits by combining the 14 bits of the E value obtained by the E-value converter 32, and 6 bits of the significands of the RGB values together. Note that, each RGB value inputted into the encoder 7 is a floating-point number.

When inputted into the clampers 31*r*, 31*g*, 31*b*, the RGB values are respectively clamped within ranges representable in the format of FIG. 5. Then, 5 bits in the exponents of the RGB values are outputted into the E-value converter 32, while 6 bits in the exponents of the RGB values are outputted into the bit combiner 33. In the E-value converter 32, the 5 bits in the exponents of the RGB values are together converted into 14 bits of the E value and outputted into the bit combiner 33. Then, in the bit combiner 33, the 14 bits of the E value obtained in the E-value converter 32, the 6 bits in the significands of the RGB values are combined together to create the image data D represented the format of FIG. 5.

Specifically, in each of the clampers 31*r*, 31*g*, 31*b*, the exponent of n to n+24 of each RGB value is represented by 0 to 23 in the 5-bit binary code for each RGB element. In this respect, suppose that sets of 5 bits in the exponents of the RGB values are denoted by Re, Ge, and Be, respectively. Here, the 14 bits of the E value can be obtained by computing $E=Re*25^2+Ge*25+Be$, for example, in the E-value converter 32, where the relation among Re, Ge, Be is switchable in any manner. Note that, since Re, Ge, and Be can take a value in the range of 0 to 24, the range of E is 0 to 15624. Thus, E is representable by 14 bits.

Here, according to the format of FIG. 5, the E-value converter 32 receives 15 bits and outputs 14 bits. Although the configuration of the E-value converter 32 is larger than that of the E-value converter 12 in FIG. 3, the dynamic range can be enlarged in comparison with the case of using the format of FIG. 1.

Figure 7:
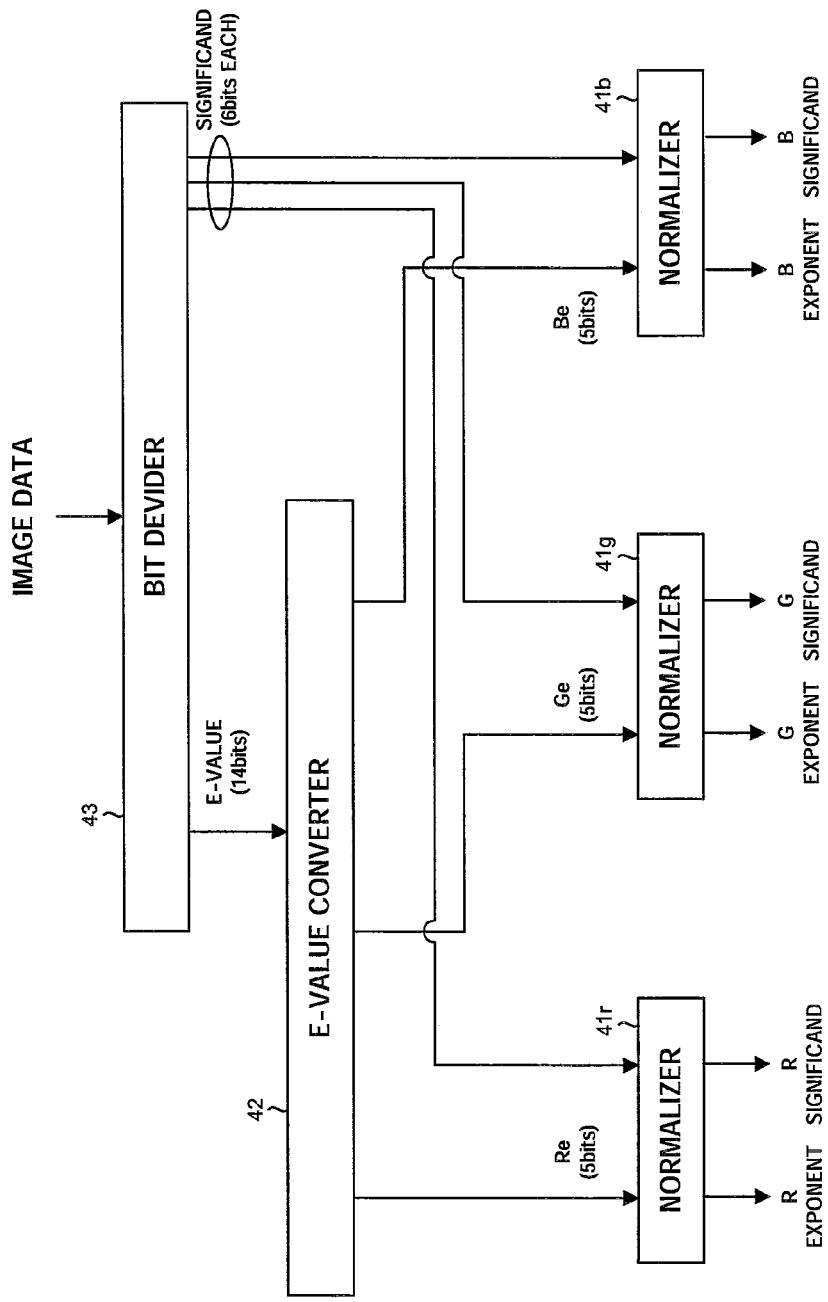
FIG. 7 is a diagram showing one example of the decoders 6a, 6b in FIG. 2 for the format of FIG. 5.

FIG. 7 is a diagram showing one example of the decoders 6*a*, 6*b* in FIG. 2 for the format of FIG. 1.

In FIG. 7, the decoders 6*a*, 6*b* of FIG. 2 each include normalizers 41*r*, 41*g*, 41*b*, an E-value inverter 42 and a bit divider 43. The bit divider 43 is capable of dividing a value of 32 bits represented in the format of FIG. 1 into: 14 bits of the E value, and 6 bits of the significands of the RGB values. The E-value inverter 42 is capable of inverting the 14 bits of the E value back into 5 bits of the RGB values. Incidentally, the E-value inverter 42 may be configured of a group of computing units or a table. The normalizers 41*r*, 41*g*, 41*b* are each capable of converting the 5 bits in the exponent of each of the RGB values, and the 6 bits of the significand of the each RGB value into each RGB value used in the image processor 9.

When inputted into the bit divider 43, the image data D represented in the format of FIG. 5 is divided into: 14 bits of the E value, and 6 bits of the significands of the RGB values. The 14 bits of the E value is then outputted into the E-value inverter 42, while the 6 bits of the significand of each RGB value is outputted into the corresponding one of the normalizers 41*r*, 41*g*, 41*b*.

Subsequently, in the E-value inverter 42, the 14 bits of the E value are inverted into 5 bits in the exponents of the RGB values, and the 5 bits in the exponents of the RGB values are outputted into the corresponding one of the normalizers 41*r*, 41*g*, 41*b*. Each of the normalizers 41*r*, 41*g*, 41*b* normalizes the 5 bits in the exponent of each of the RGB values, and the 6 bits of the significand of the each RGB value, according to the floating-point format, which are then outputted into the image processor 9.

Figure 8:
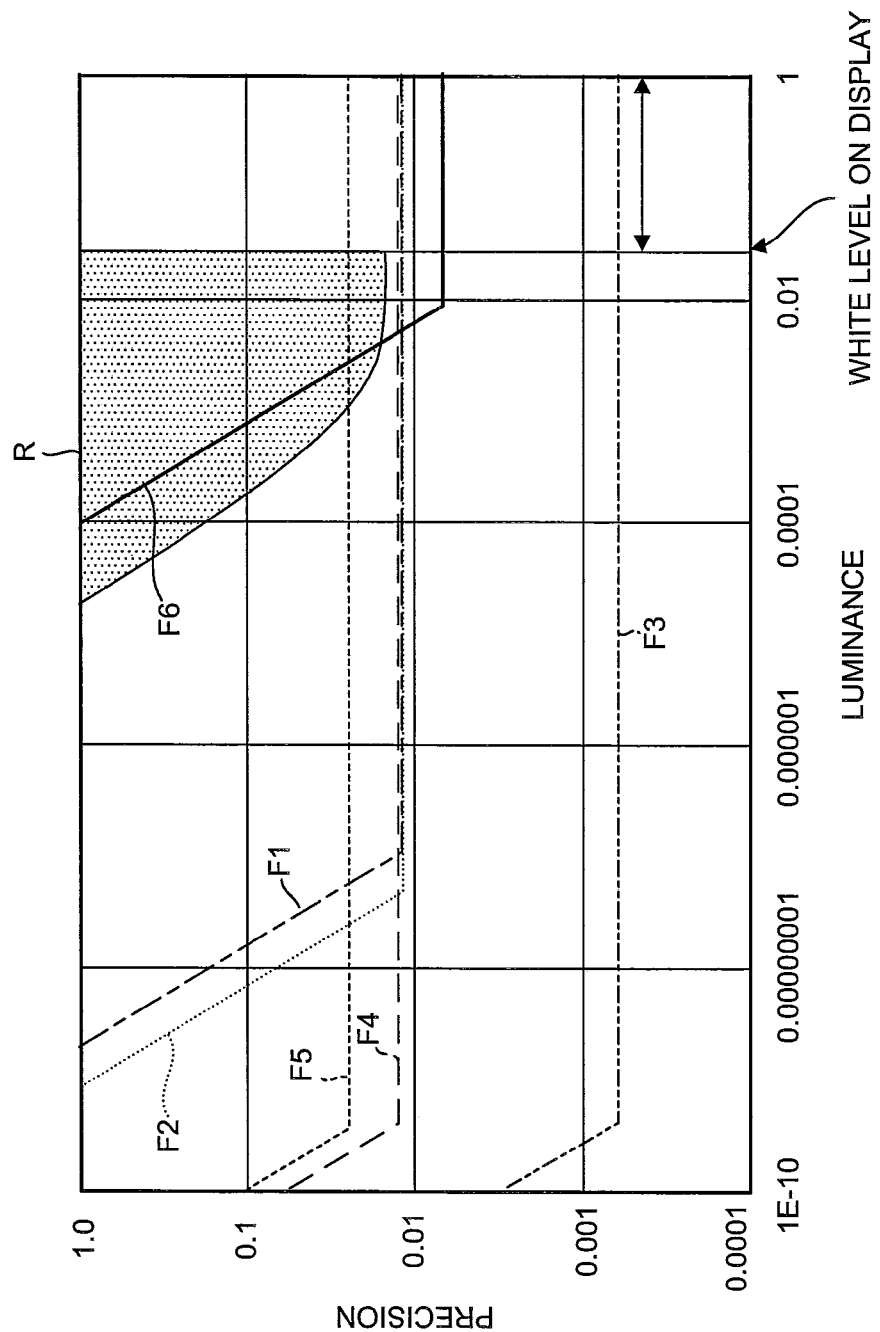
FIG. 8 is a graph showing relations between the luminance and the precision which are represented in the formats according to the embodiments of the present invention in comparison with conventional formats.

FIG. 8 is a graph showing relations between the luminance and the precision which are represented in the formats according to the embodiments of the present invention in comparison with conventional formats. Note that, F1 shows the relation between the luminance and the precision represented in the format of FIG. 1; F2 shows the relation between the luminance and the precision represented in the format of FIG. 5; F3 shows the relation between the luminance and the precision represented R16G16B16A16_FLOAT; F4 shows the relation between the luminance and the precision represented in R11G11B10_FLOAT (Red, Green); F5 shows the relation between the luminance and the precision represented in R11G11B10_FLOAT (Blue); and F6 shows the relation between the luminance and the precision represented in R10G10B10A2_FLOAT.

In FIG. 8, according to R16G16B16A16_FLOAT, a large dynamic range can be ensured with high precision. However, a 64-bit capacity is consumed per pixel. According to R11G11B10_FLOAT, since the significand for a B channel is as small as 5 bits, the line F5 partially passes through a region R where Mach bands are perceived. According to R10G10B10A2_FLOAT, since only 3 bits are assigned to the exponent, the line F6 partially passes through the region R where Mach bands are perceived.

In contrast, according to the formats of FIGS. 1 and 5, large dynamic ranges can be ensured in comparison with R10G10B10A2_FLOAT while the lines F1 and F2 avoid passing through the region R where Mach bands is perceived.

It should be noted that the vertex processing engine 1, the rasterizer 2, the pixel processing engine 3, the texture engine 4, the decoders 6a, 6b and the encoder 7 can be achieved by causing a computer to executes a program in which instructions for the processings in these blocks are written.

With the program saved in a storage medium such as CD-ROM, when the storage medium is inserted into a computer in the image processing apparatus to install the program on the computer, it is possible to achieve the processings which are supposed to be carried out by the vertex processing engine 1, the rasterizer 2, the pixel processing engine 3, the texture engine 4, the decoders 6a, 6b and the encoder 7.

When the program in which the instructions for the processings carried out by the vertex processing engine 1, the rasterizer 2, the pixel processing engine 3, the texture engine 4, the decoders 6a, 6b and the encoder 7 are written is executed by a computer, the program may be executed by a stand-alone computer, or may be executed through distributed processing by multiple computers connected to a network.

What is claimed is:

1. An image processing apparatus comprising:
a storage which stores first pixel-data representing color and brightness of a pixel, the first pixel-data including $1^{st}$, $2^{nd}$ and $3^{rd}$ component data each represented in a first floating-point format which includes a significand and an exponent, a bit length of the first pixel-data being the sum of a bit length of the significands and the rounded up sum of a bit length of exponents, wherein the bit length of a significand is 6 bits and the bit length of an exponent is $\log_2 24$ bits; and
an image processor which processes the first pixel-data.

2. The image processing apparatus of claim 1, further comprising:
a decoder which converts the $1^{st}$, $2^{nd}$ and $3^{rd}$ component data of the first pixel-data represented in the first format into second pixel-data, the second pixel data including the $1^{st}$, $2^{nd}$ and $3^{rd}$ component data each represented in a second floating-point format which includes a significand and an exponent, wherein the bit length of a significand of the second floating-point format is 6 bits and the bit length of a exponent of the second floating-point format is 5 bits; and
an encoder which converts the second pixel-data into the first pixel-data.

3. The image processing apparatus of claim 1, wherein $1^{st}$, $2^{nd}$ and $3^{rd}$ component respectively represents R element, G element and B element of a pixel.

4. The image processing apparatus of claim 2, wherein the encoder includes:
an interface which receives the second pixel-data;
a converter which converts higher-order 2 bits in the exponents of the second input-data into 5 bits of an E value; and
a bit combiner which combines the 5 bits of the E value, lower-order 3 bits in the exponents of the second input-data, and 6 bits of the significands of the second input-data together to thereby create a value of 32 bits.

5. The image processing apparatus of claim 2, wherein the decoder includes:
an interface which receives the first input-data represented in the first floating-point format;
a bit divider which divides the first input-data into 5 bits of an E value, lower-order 3 bits in the exponents and 6 bits of the significands; and
an E-value inverter which inverts the 5 bits of the E value into higher-order 2 bits in the exponents.

6. An image processing apparatus comprising:
a storage which stores first pixel-data representing color and brightness of a pixel, the first pixel-data including $1^{st}$, $2^{nd}$ and $3^{rd}$ component data each represented in a first floating-point format which includes a significand and an exponent, a bit length of the first pixel-data being the sum of a bit length of the significands and the rounded up sum of a bit length of exponents, wherein the bit length of a significand is 6 bits and the bit length of an exponent is $\log_2 25$ bits; and
an image processor which processes the first pixel-data.

7. The image processing apparatus of claim 6, further comprising
a decoder which converts the $1^{st}$, $2^{nd}$ and $3^{rd}$ component data of the first pixel-data represented in the first format into second pixel-data, the second pixel data including the $1^{st}$, $2^{nd}$ and $3^{rd}$ component data each represented in a second floating-point format which includes a significand and an exponent, wherein the bit length of a significand of the second floating-point format is 6 bits and the bit length of an exponent of the second floating-point format is 5 bits; and
an encoder which converts the second pixel-data into the first pixel-data.

8. The image processing apparatus of claim 6, wherein the $1^{st}$, $2^{nd}$ and $3^{rd}$ component respectively represents R element, G element and B element of a pixel.

9. The image processing apparatus of claim 7 wherein the encoder includes:
an interface which receives the second pixel-data;
converter which converts 5 bits in the exponents of the second pixel-data together into 14 bits of an E value; and
a bit combiner which combines the 14 bits of the E value and 6 bits of the significands of the second pixel-data together to thereby create a value of 32 bits.

10. An image processing apparatus of claim 9, wherein the decoder includes:

an interface which receives the first input-data represented in the first floating format;
a bit divider which divides the first input-data into 14 bits of an E value, and 6 bits of the significands; and
an E-value inverter which inverts the 14 bits of the E value into 5 bits in the exponents of the RGB elements.

\* \* \* \* \*